US010534266B2

(12) United States Patent
Carcasi et al.

(10) Patent No.: US 10,534,266 B2
(45) Date of Patent: *Jan. 14, 2020

(54) METHODS AND TECHNIQUES TO USE WITH PHOTOSENSITIZED CHEMICALLY AMPLIFIED RESIST CHEMICALS AND PROCESSES

(71) Applicant: TOKYO ELECTRON LIMITED, Tokyo (JP)

(72) Inventors: Michael A. Carcasi, Austin, TX (US); Joshua S. Hooge, Austin, TX (US); Benjamen M. Rathsack, Austin, TX (US); Seiji Nagahara, Sagamihara (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/445,738

(22) Filed: Feb. 28, 2017

(65) Prior Publication Data

US 2017/0192357 A1 Jul. 6, 2017

Related U.S. Application Data

(63) Continuation of application No. 14/629,843, filed on Feb. 24, 2015, now Pat. No. 9,618,848.

(Continued)

(51) Int. Cl.
*G03F 7/038* (2006.01)
*G03F 7/039* (2006.01)
(Continued)

(52) U.S. Cl.
CPC .......... *G03F 7/2022* (2013.01); *G03F 7/0045* (2013.01); *G03F 7/0382* (2013.01);
(Continued)

(58) Field of Classification Search
None
See application file for complete search history.

(56) References Cited

U.S. PATENT DOCUMENTS 4,402,571 A 9/1983 Cowan et al.
4,609,615 A 9/1986 Yamashita et al.
(Continued)

FOREIGN PATENT DOCUMENTS

CN 101738872 B 4/2013
EP 583205 A1 2/1994
(Continued)

OTHER PUBLICATIONS

Korean Intellectual Property Office, English translation of Office Action issued in related KR Patent Application No. 2016-7025792 dated Oct. 18, 2017, 7 pp.
(Continued)

*Primary Examiner* — Martin J Angebranndt
(74) *Attorney, Agent, or Firm* — Wood Herron & Evans LLP

(57) ABSTRACT

The disclosure herein describes methods for Photosensitized Chemically Amplified Resist Chemicals (PS-CAR) to pattern light sensitive films on a semiconductor substrate. In one embodiment, a two-step exposure process may generate higher acid concentration regions within a photoresist layer. The PS-CAR chemicals may include photoacid generators (PAGs) and photosensitizer elements that enhance the decomposition of the PAGs into acid. The first exposure may be a patterned EUV exposure that generates an initial amount of acid and photosensitizer. The second exposure may be a non-EUV flood exposure that excites the photosensitizer which increases the acid generation rate where the photosensitizer is located on the substrate. The distribution of energy during the exposures may be optimized by using certain characteristics (e.g., thickness, index of refraction, doping) of the photoresist layer, an underlying layer, and/or an overlying layer.

22 Claims, 4 Drawing Sheets

Related U.S. Application Data

(60) Provisional application No. 61/944,041, filed on Feb. 24, 2014.

(51) Int. Cl.
| | |
|---|---|
| G03F 7/20 | (2006.01) |
| G03F 7/09 | (2006.01) |
| G03F 7/30 | (2006.01) |
| G03F 7/26 | (2006.01) |
| G03F 7/38 | (2006.01) |
| G03F 7/11 | (2006.01) |
| H01L 21/027 | (2006.01) |
| G03F 7/004 | (2006.01) |

(52) U.S. Cl.
CPC ............. *G03F 7/0392* (2013.01); *G03F 7/09* (2013.01); *G03F 7/091* (2013.01); *G03F 7/11* (2013.01); *G03F 7/2002* (2013.01); *G03F 7/2004* (2013.01); *G03F 7/2024* (2013.01); *G03F 7/26* (2013.01); *G03F 7/30* (2013.01); *G03F 7/38* (2013.01); *H01L 21/0271* (2013.01); *H01L 21/0274* (2013.01); *H01L 21/0276* (2013.01)

(56) References Cited

U.S. PATENT DOCUMENTS

| | | | |
|---|---|---|---|
| 4,751,169 A | 6/1988 | Behringer et al. | |
| 4,804,612 A | 2/1989 | Asaumi et al. | |
| 4,931,380 A | 6/1990 | Owens et al. | |
| 4,933,263 A | 6/1990 | Okuda et al. | |
| 5,370,973 A | 12/1994 | Nishii | |
| 5,534,970 A | 7/1996 | Nakashima et al. | |
| 5,707,784 A | 1/1998 | Oikawa et al. | |
| 5,820,679 A | 10/1998 | Yokoyama et al. | |
| 5,905,019 A | 5/1999 | Obszarny | |
| 6,180,320 B1 | 1/2001 | Saito et al. | |
| 6,242,160 B1 * | 6/2001 | Fukuzawa | G03F 7/091 430/313 |
| 6,245,492 B1 | 6/2001 | Huang et al. | |
| 6,296,985 B1 | 10/2001 | Mizutani et al. | |
| 6,331,383 B1 | 12/2001 | Sakai | |
| 6,440,632 B2 | 8/2002 | Yasuda | |
| 6,555,479 B1 | 4/2003 | Hause et al. | |
| 6,844,135 B2 | 1/2005 | Kon et al. | |
| 6,900,001 B2 | 5/2005 | Livesay et al. | |
| 6,968,253 B2 | 11/2005 | Mack et al. | |
| 7,142,941 B2 | 11/2006 | Mack et al. | |
| 7,327,436 B2 | 2/2008 | Fukuhara et al. | |
| 7,488,933 B2 | 2/2009 | Ye et al. | |
| 7,829,269 B1 | 11/2010 | Fonseca et al. | |
| 7,858,289 B2 * | 12/2010 | Yamashita | G03F 7/0045 430/270.1 |
| 7,966,582 B2 | 6/2011 | Melvin, III et al. | |
| 8,088,548 B2 | 1/2012 | Houlihan et al. | |
| 8,428,762 B2 | 4/2013 | Graves et al. | |
| 8,443,308 B2 | 5/2013 | Shiely et al. | |
| 8,589,827 B2 | 11/2013 | Biafore et al. | |
| 9,009,647 B2 | 4/2015 | Ye et al. | |
| 9,519,227 B2 | 12/2016 | Carcasi et al. | |
| 9,618,848 B2 | 4/2017 | Carcasi et al. | |
| 9,645,495 B2 | 5/2017 | deVilliers | |
| 9,746,774 B2 * | 8/2017 | Carcasi | G03F 7/2022 |
| 10,020,195 B2 * | 7/2018 | Scheer | G03F 7/11 |
| 2002/0030800 A1 | 3/2002 | Nellissen | |
| 2002/0102490 A1 | 8/2002 | Ito et al. | |
| 2003/0163295 A1 | 8/2003 | Jakatdar et al. | |
| 2005/0008864 A1 | 1/2005 | Ingen Schenau et al. | |
| 2005/0214674 A1 | 9/2005 | Sui et al. | |
| 2006/0040208 A1 | 2/2006 | Tarutani et al. | |
| 2006/0269879 A1 | 11/2006 | Elian et al. | |
| 2007/0032896 A1 | 2/2007 | Ye et al. | |
| 2007/0184648 A1 | 8/2007 | Yoon et al. | |
| 2007/0275330 A1 | 11/2007 | Bailey et al. | |
| 2007/0292770 A1 | 12/2007 | Strauss | |
| 2008/0038675 A1 | 2/2008 | Nagasaka | |
| 2008/0230722 A1 * | 9/2008 | Elian | B82Y 10/00 250/492.2 |
| 2009/0162796 A1 | 6/2009 | Yun et al. | |
| 2009/0214985 A1 * | 8/2009 | Kulp | G03F 7/40 430/322 |
| 2009/0274974 A1 | 11/2009 | Abdallah et al. | |
| 2010/0119972 A1 | 5/2010 | Houlihan et al. | |
| 2010/0213580 A1 | 8/2010 | Meador et al. | |
| 2010/0245790 A1 | 9/2010 | Seltmann et al. | |
| 2010/0273099 A1 | 10/2010 | Fonseca et al. | |
| 2010/0291490 A1 | 11/2010 | Tsuruda et al. | |
| 2011/0043791 A1 | 2/2011 | Smilde et al. | |
| 2011/0147984 A1 | 6/2011 | Cheng et al. | |
| 2011/0171569 A1 | 7/2011 | Nishimae et al. | |
| 2011/0177464 A1 | 7/2011 | Takeda et al. | |
| 2011/0205505 A1 * | 8/2011 | Somervell | G03F 7/30 355/27 |
| 2011/0250540 A1 | 10/2011 | Huang et al. | |
| 2013/0084532 A1 | 4/2013 | Wu et al. | |
| 2013/0164691 A1 | 6/2013 | Shiobara | |
| 2013/0171571 A1 | 7/2013 | Dunn et al. | |
| 2013/0204594 A1 | 8/2013 | Liu | |
| 2013/0232457 A1 | 9/2013 | Ye et al. | |
| 2013/0234294 A1 | 9/2013 | Hu et al. | |
| 2013/0260313 A1 | 10/2013 | Allen et al. | |
| 2014/0227538 A1 | 8/2014 | Baldwin et al. | |
| 2015/0214056 A1 | 7/2015 | Xu et al. | |
| 2015/0241781 A1 | 8/2015 | Carcasi et al. | |
| 2015/0241782 A1 | 8/2015 | Scheer et al. | |
| 2015/0241783 A1 | 8/2015 | Carcasi et al. | |
| 2015/0241793 A1 | 8/2015 | Carcasi et al. | |
| 2016/0004160 A1 | 1/2016 | Tagawa et al. | |
| 2016/0048080 A1 | 2/2016 | deVilliers | |
| 2016/0357103 A1 | 12/2016 | Nagahara et al. | |
| 2017/0052448 A1 * | 2/2017 | Nakagawa | G03F 7/0397 |
| 2017/0052449 A1 * | 2/2017 | Nakagawa | C07D 317/72 |
| 2017/0052450 A1 * | 2/2017 | Nakagawa | G03F 7/2032 |
| 2017/0242342 A1 * | 8/2017 | Carcasi | G03F 7/004 |
| 2017/0242344 A1 * | 8/2017 | Carcasi | G03F 7/004 |
| 2017/0329229 A1 * | 11/2017 | Carcasi | G03F 7/2024 |
| 2017/0330806 A1 * | 11/2017 | deVilliers | H01L 21/0274 |

FOREIGN PATENT DOCUMENTS

| | | | |
|---|---|---|---|
| EP | 2048700 A2 | 4/2009 | |
| JP | 09-211871 A | 8/1992 | |
| JP | 2000-208408 * | 7/2000 | ............. G03F 7/039 |
| JP | 2002006512 A | 1/2002 | |
| JP | 2007501431 A | 1/2007 | |
| JP | 2007334036 A | 12/2007 | |
| JP | 04-239116 B2 | 3/2009 | |
| JP | 2013140319 A | 7/2013 | |
| JP | 2013228447 A | 11/2013 | |
| JP | 201429435 A | 2/2014 | |
| JP | 2015172741 A | 10/2015 | |
| KR | 20120058572 A | 6/2012 | |
| TW | I273457 B | 2/2007 | |
| TW | 201539539 A | 10/2015 | |
| TW | 201541194 A | 11/2015 | |
| WO | 20030030012 A2 | 1/2003 | |
| WO | 2013007442 A1 | 1/2013 | |
| WO | 2005013007 A1 | 2/2015 | |

OTHER PUBLICATIONS

Korean Intellectual Property Office, English translation of Office Action issued in related KR Patent Application No. 2016-7026114 dated Oct 17, 2017, 5 pp.

S. Tagawa, et al., "Super High Sensitivity Enhancement by Photo-Sensitized Chemically Amplified Resist Process", Journal of Photopolymer Science and Technology, vol. 26, No. 6 (2013), pp. 825-830.

(56) References Cited

OTHER PUBLICATIONS

S. Tagawa, et al., "New Sensitization Method of Chemically Amplified EUV/EB Resists," presented at the 2013 International Symposium on EUV Lithography. Toyama, Japan Oct. 6-10, 2013.
A Ravve, "Light-Associated Reactions of Synthetic Polymers", Springer Science-Business Media, ISBN 0387318038, pp. 23-25, 2006.
International Searching Authority, Search Report and Written Opinion issued in related International Application PCT/US2015/017056, dated May 29, 2015, 10 pp.
International Searching Authority, Search Report and Written Opinion issued in related International Application PCT/US2015/017071 dated May 29, 2015, 13 pp.
International Bureau of WIPO, International Preliminary Report on Patentability issued in related International Application No. PCT/US2015/017056 dated Aug. 30, 2016, 7 pp.
International Bureau of WIPO, International Preliminary Report on Patentability issued in related International Application No. PCT/US2015/017071 dated Aug. 30, 2016, 10 pp.
Japan Patent Office, Office Action issued in related JP Application No. 2016-553436 dated Dec. 12, 2017, 16 pp. including English translation.
Japan Patent Office, Official Action issued in related JP Patent Application No. 2016-553422 dated May 30, 2017, 8 pp., including English translation.
Nagahara et al., Challenge Toward Breakage of RLS Trade-off for UEV Lithography by Photosensitized Chemically Ampliefied Resist (PSCAR) with Flood Exposure, SPIE International Society for Optical Engineering Proceedings, vol. 9776, Mar. 18, 2016, 18 pp.
International Searching Authority, Search Report and Written Opinion issued in related International Application PCT/US2017/018332 dated Jun. 1, 2017, 12 pp.
International Searching Authority, Search Report and Written Opinion issued in related International Application PCT/US2017/018337 dated Jun. 5, 2017, 12 pp.
International Searching Authority, Search Report and Written Opinion issued in related International Application PCT/US2017/032450, dated Aug. 10, 2017, 12 pp.
International Searching Authority, Search Report and Written Opinion issued in related International Application PCT/US2017/032435, dated Aug. 14, 2017, 14 pp.
International Bureau of WIPO, International Preliminary Report on Patentability issued in corresponding International Application No. PCT/US2015/017056 dated Aug. 30, 2016, 7 pp.
Lowes et al. "Comparative study of photosensitive versus Non-photosensitive developer-soluble bottom anti-reflective coating system", ECS Transactions 27(1) pp. 503-508 (2010).
"Understanding Brewer Science ARC products", Brewer Science (23 pages (2002)).
Japan Patent Office, Official Action issued in related JP Patent Application No. 2016-553436 dated May 23, 2017, 18 pp., including English translation.
Taiwan Intellectual Property Office; Notice of Examination Opinions issued in counterpart application TW Application No. 106115716 dated Jun. 8, 2018, 9 pp. including English translation.
Taiwan Intellectual Property Office, Notice of Examination Opinions issued in counterpart application TW Application No. 106105400 dated Mar. 28, 2018, 13 pp, including English translation.
U.S. Patent and Trademark Office, Non-final Office Action issued in corresponding U.S. Appl. No. 15/594,187 dated Mar. 22, 2018, 53 pp.
Japan Patent Office, Office Action issued in related JP Patent Application No. 2016-553436 dated Jun. 19, 2018, 10 pp., including English translation.
Taiwan Intellectual Property Office, Office Action issued in related TW Patent Application No. 106105403 dated Jun. 28, 2018, 7 pp., including English translation.
U.S. Patent and Trademark Office, Non-final Office Action issued in corresponding U.S. Appl. No. 15/048,584 dated Aug. 8, 2018, 45 pp.
U.S. Patent and Trademark Office, Final Office Action issued in related U.S. Appl. No. 14/629,968 dated Jun. 1, 2017.
US Patent and Trademark Office, Office Action issued in related U.S. Appl. No. 14/629,968 dated Aug. 23, 2017.
U.S. Patent and Trademark Office, Non-final Office Action issued in related U.S. Appl. No. 15/048,619 dated Dec. 6, 2017.
Japan Patent Office, Office Action issued in related JP Application No. 2016-553436 dated Dec. 12, 2017, including English translation.
U.S. Patent and Trademark Office, Office Action in corresponding U.S. Appl. No. 15/594,139 dated Jan. 10, 2019.
U.S. Patent and Trademark Office, Final Office Action issued in related U.S. Appl. No. 14/629,968 dated Jun. 1, 2017, 20 pp.
US Patent and Trademark Office, Office Action issued in related U.S. Appl. No. 14/629,968 dated Aug. 23, 2017, 27 pp.
U.S. Patent and Trademark Office, Non-final Office Action issued in related U.S. Appl. No. 15/048,619 dated Dec. 6, 2017, 17 pp.
Taiwan Intellectual Property Office, Notice of Allowance issued in corresponding Taiwanese Patent Application No. 106115728 dated Feb. 15, 2019.
U.S. Patent and Trademark Office, Office Action issued in corresponding U.S. Appl. No. 16/154,018 dated Mar. 8, 2019.
U.S. Patent and Trademark Office, Office Action issued in corresponding U.S. Appl. No. 15/048,584 dated Feb. 15, 2019.
Wang, C.W. et al., "Photobase generator and photo decomposable quencher for high-resolution photoresist applications," Proc. SPIE 7639, Advances in Resist Materials and Processing Technology XXVII, 76390W (Mar. 29, 2010).
U.S. Patent and Trademark Office, Office Action in corresponding U.S. Appl. No. 15/594,139 dated Aug. 9, 2019.
Semiconductor Onesource: Semiconductor Glossary—Search for: critical dimension, cd copyright 2016, one page (Year: 2016).
Kang et al., Microelectronics Reliability 46 (2006) 1006-1012. (Year: 2006).
Definition of critical dimension—cd—Chemistry Dictionary Definition of critical dimension (CD) copyright 2017 one page from chemicool.com. (Year 2017).
Japanese Patent Office, Office Action in corresponding Japanese Patent Application No. 2016-570931 dated Aug. 20, 2019.

\* cited by examiner

METHODS AND TECHNIQUES TO USE WITH PHOTOSENSITIZED CHEMICALLY AMPLIFIED RESIST CHEMICALS AND PROCESSES

CROSS REFERENCE TO RELATED APPLICATIONS

The present application is a continuation of U.S. patent application Ser. No. 14/629,843, filed on Feb. 24, 2015, now U.S. Pat. No. 9,618,848, which claims the benefit of U.S. Provisional Patent Application No. 61/944,041, filed on Feb. 24, 2014, entitled "Methods and Techniques to use with Photosensitized Chemically Amplified Resist Chemicals and Processes," which are incorporated herein by reference in their entireties.

BACKGROUND OF THE INVENTION

Critical dimension (CD) control for photolithography patterning is important for semiconductor device manufacturing. One aspect of patterning includes generating patterns on photosensitive materials that may be imparted to underlying layers or the substrate by subsequent processing. However, the quality of the overlying patterns has a strong impact on the quality of the patterns on the underlying layers. Also, as CDs scale to smaller dimensions, patterning processes have incorporated smaller wavelengths of light that may not have as many photons as the larger light wavelengths. As a result, the amount of acid generated within the photosensitive materials may be lower. Hence, any materials or techniques that increase amount of acid generated per EUV photon may be desirable.

SUMMARY

One approach to improving acid generation within photosensitive materials may be to incorporate chemical compounds that amplify the chemical reactions that may occur during the exposure and subsequent processes. One example of this approach may be to use a photosensitive chemically amplified resist (PS-CAR) that may increase the chemical reactions or chemical concentrations within the photosensitive material or photoresist. The chemical concentrations within the photoresist may be controlled by using a two-step exposure process. The first exposure may be a patterned exposure that generates a photosensitizer (PS) and an acid generated from a photoacid generator (PAG) by the reaction of chemicals within the resist. The first exposure process may be tuned to maximize the absorbance by the PS and maximize the absorbance of the PAG. This may be accomplished, in one embodiment, by choosing light wavelengths of less than 300 nm. The second exposure may excite the PS which may decompose additional PAG to obtain amplification of the acid in the exposed pattern area while minimizing the acid concentration in the dark or unexposed areas of the first exposure. In one embodiment, the two-step exposure process may use two different wavelengths (e.g., extreme ultraviolet (EUV), Ultraviolet light). The patterned exposure may use EUV spectrum wavelengths and the flood exposure may use UV spectrum wavelengths.

One concern with using a PS-CAR may be reflectivity and absorption control associated with the exposure steps that may be exposed to the resist. In one embodiment, reflectivity and absorption control may be addressed by tailoring the film layer under (e.g., underlayer (UL)) the typical photoresist to have either minimal or no reflections during the flood exposure. This may be accomplished by using a material that has high absorption of the flood wavelength(s). For example, the index of refraction differences between the resist layer and the UL may be used to tailor the highest intensity from the interference of the incoming light and the reflected flood light to be preferentially located in the resist layer (e.g. near resist/UL interface) as a way to prevent micro-bridging and/or scumming or as a way to have some tailored resist profile control when the resist is developed.

In another embodiment, one or more top coat layers may be deposited on the resist to optimize PAG decomposition. The top coat layer(s) may be designed for outgassing and out-of-band (OOB) radiation control. For example, in the EUV/UV exposure process, it may be desirable to prevent inadvertent PAG decomposition by EUV OOB radiation (~248 nm) but allow the UV flood target exposure wavelengths to excite the PS. In one specific embodiment, a first top coat may be deposited on the photoresist prior to the first exposure. The first top coat may be removed from the substrate and a second top coat layer may be deposited on the photoresist layer prior to the flood exposure. In another embodiment, the top coat layer may be applied prior to the first exposure and removed before the second exposure. A second top coat layer does not need to be applied prior to the second exposure.

A second concern for the PS-CAR concept may be related to the EUV shot noise effect when the PS-CAR concept is pushed to its extremes of low EUV dose exposure. Pushing EUV exposure dose to its minimum limits, a photon/secondary electron shot statistics problem, known as EUV shot noise, may be present. Since the photosensitizer is created in close proximity to any acids converted from PAGs, the photosensitizer will largely replicate the issue and thus have a photosensitizer concentration shot noise effect. Without smoothing of the photosensitizer concentration shot noise prior to or in-situ to UV flood excitation, the photosensitizer concentration shot noise will likely lead to non-optimum line width roughness (LWR), LER, and CWR depending on feature type. Incorporating a bake step prior to UV flood step to induce photosensitizer diffusion, on the order sub 10 nm, may smooth out the photosensitizer concentration shot noise and lead to better LWR, LER and or CER.

BRIEF DESCRIPTIONS OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

Figure 2:
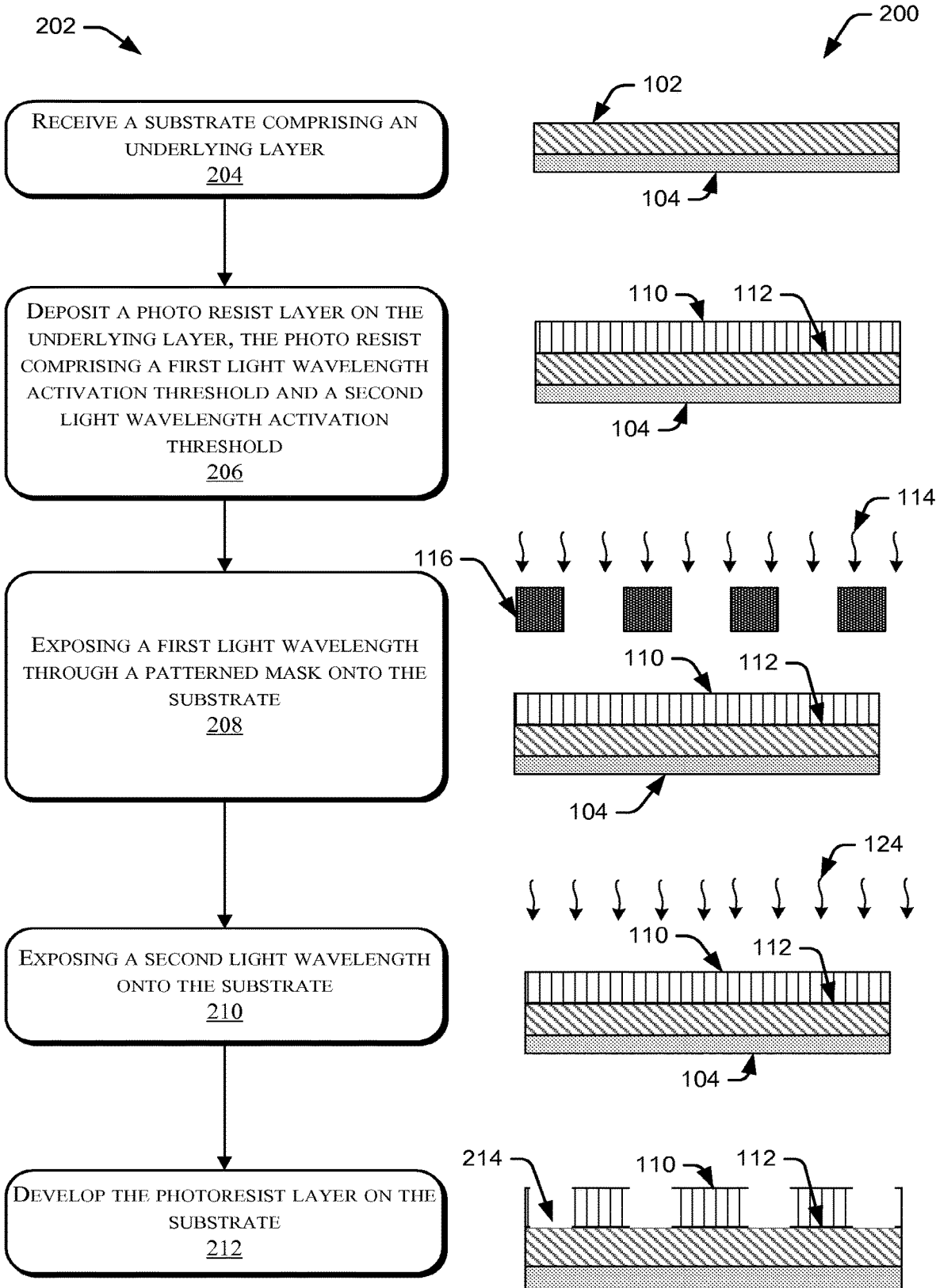

FIG. 2 includes an illustration of a flow diagram of a method for a two-step exposure process of a film stack and accompanying cross section representations of one embodiment of the method.

Figure 3A:
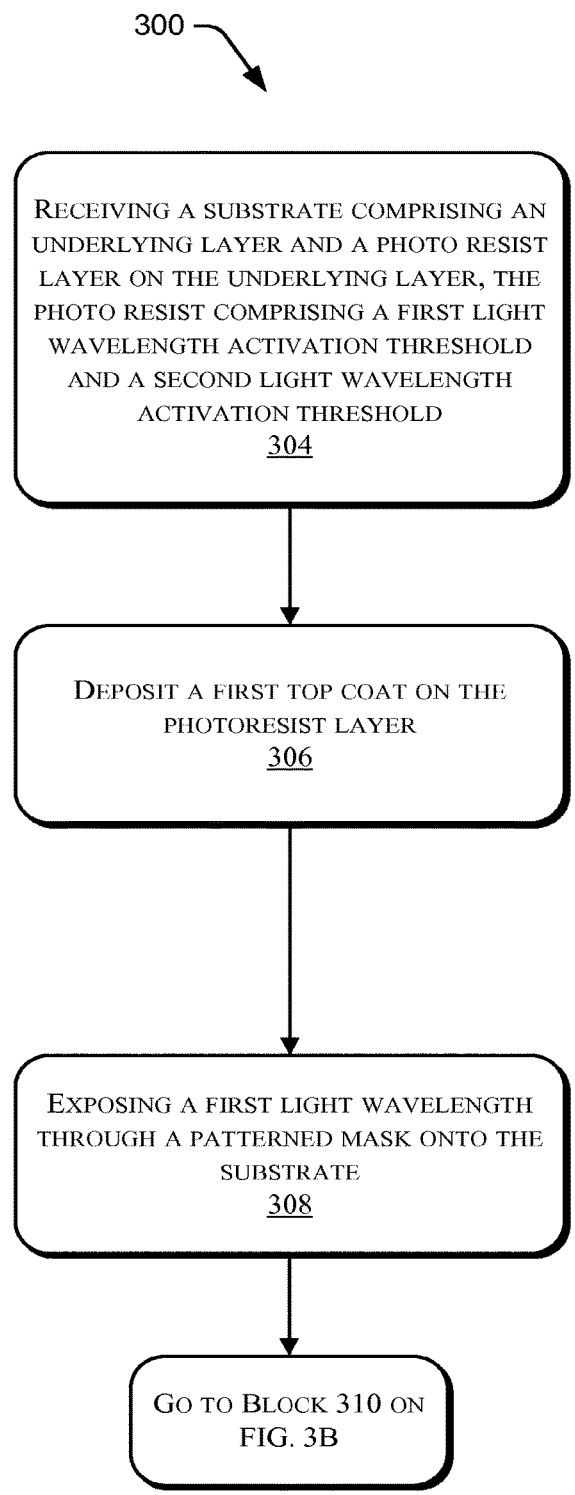
Figure 3A:
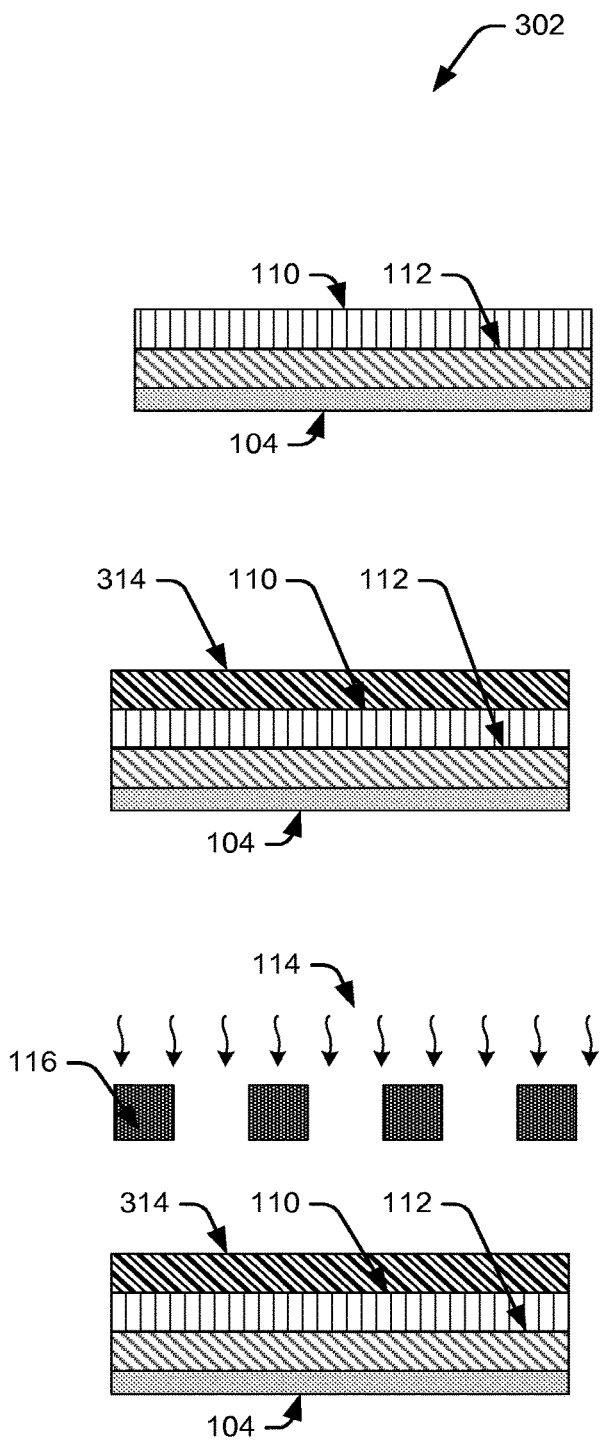
Figure 3B:
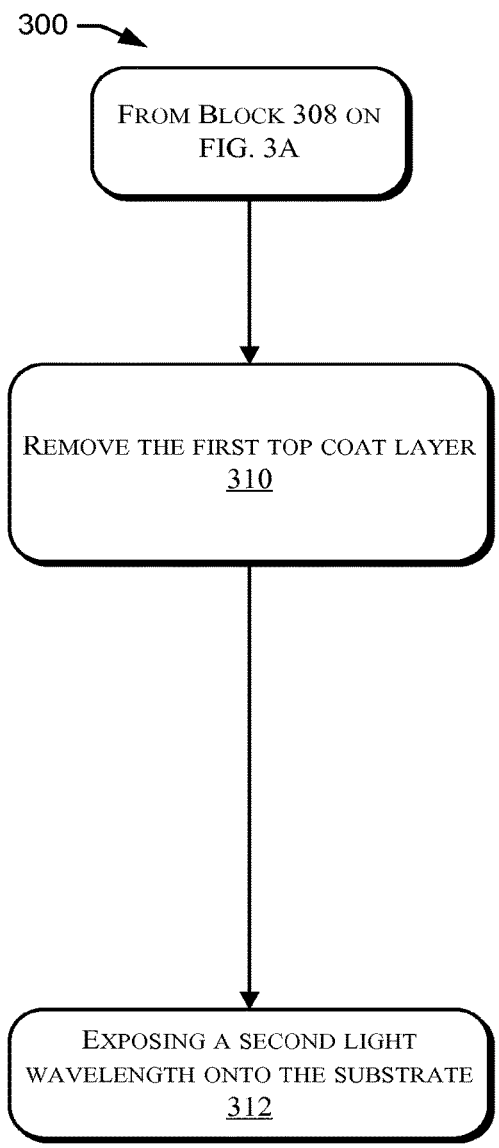
Figure 3B:
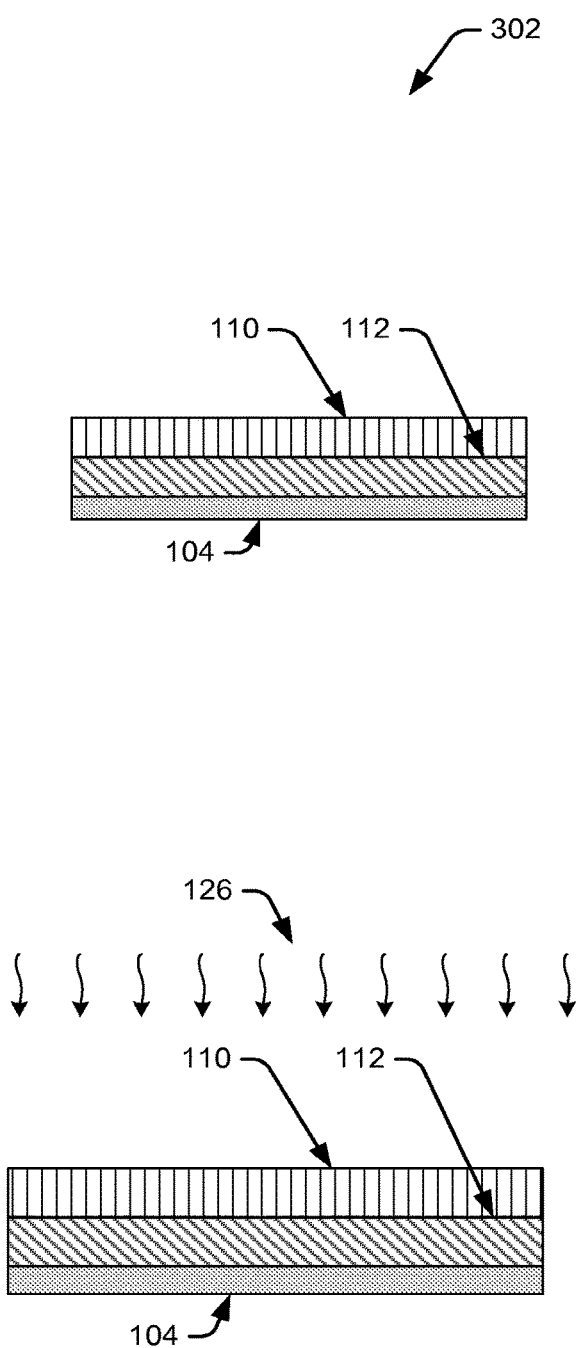

FIGS. 3A-3B include an illustration of a flow diagram of a method for a two-step exposure process of a film stack and accompanying cross section representations of one embodiment of the method.

DETAILED DESCRIPTION

Although the present invention will be described with reference to the embodiments shown in the drawings, it should be understood that the present invention can be embodied in many alternate forms of embodiments. In addition, any suitable size, shape or type of elements or materials could be used.

In semiconductor manufacturing, photoresist or light sensitive materials have been used to manufacture electronic devices by depositing, patterning, and etching films on a substrate. Shrinking the dimensions of the electronic devices and maintaining image quality (e.g., resolution, line width roughness, and sensitivity) to improve device performance and yield. Extreme Ultraviolet (EUV) photolithography is one approach to shrinking dimensions that has inherent limitations that may impact existing photoresist chemistries. For example, EUV photoresist may need to compensate for the lower power of EUV light sources while maintaining resist sensitivity and image resolution. One approach to addressing the lower power limitation may include using Photosensitized Chemically Amplified Resist (PS-CAR) as described in the paper entitled "Super High Sensitivity Enhancement by Photo-Sensitized Chemically Amplified Resist (PS-CAR) Process," by Seiichi Tagawa, et. al., Journal of Photopolymer Science and Technology, vol. 26 (2013) No. 6, pg. 825-830. Although the use of PS-CAR has provided an opportunity to enable EUV processing, additional techniques may be used to improve adsorption and reflectivity control in the photoresist to improve image quality for EUV processing.

The PS-CAR chemistry may be enabled by a two-step exposure process that may generate different concentrations of acid and/or photosensitizer (PS) based, at least in part, on the type of light being exposed to the substrate coated with the photoresist. The acid may be generated when the light or secondary electrons generated by the absorption of light interact with the PAG in the photoresist and the PS may be generated when the light interacts with the PS generator that is incorporated into the photoresist.

The PS-CAR photoresist may include a photosensitizer generation compound and a photoacid generation (PAG) compound. A photosensitizer molecule may absorb light energy and transfer the light energy to another molecule (e.g., PAG). Some PS compounds may transfer energy in a ground state while others may conduct the transfer in an excited state. The PS generation compound may include, but is not limited to acetophenone, triphenylene, benzophenone, fluorenone, anthraquinone, phenanthrene, or derivatives thereof. A photoacid generator (PAG) may be cationic photoinitiator that may convert absorbed light energy into chemical energy (e.g., acidic reaction). The acid generation compound may include, but is not limited to, at least one of the following: triphenylsulfoniumtriflate, triphenylsulfoniumnonaflate, triphenylsulfoniumperfluorooctylsulfonate, triarylsulfoniumtriflate, triarylsulfoniumnonaflate, triarylsulfoniumperfluorooctylsulfonate, a triphenylsulfonium salt, a triarylsulfonium salt, a triarylsulfoniumhexafluoroantimonate salt, N-hydroxynaphthalimidetriflate, 1,1-bis[p-chlorophenyl]-2,2,2-trichloroethane (DDT), 1,1-bis[p-methoxyphenyl]-2,2,2-trichloroethane, 1,2,5,6,9,10-hexabromocyclododecane, 1,10-dibromodecane, 1,1-bis[p-chlorophenyl]2,2-dichloroethane, 4,4-dichloro-2-(trichloromethyl)benzhydrol, 1,1-bis(chlorophenyl) 2-2,2-trichloroethanol, hexachlorodimethylsulfone, 2-chloro-6-(trichloromethyl)pyridine, or derivatives thereof.

Figure 1A:
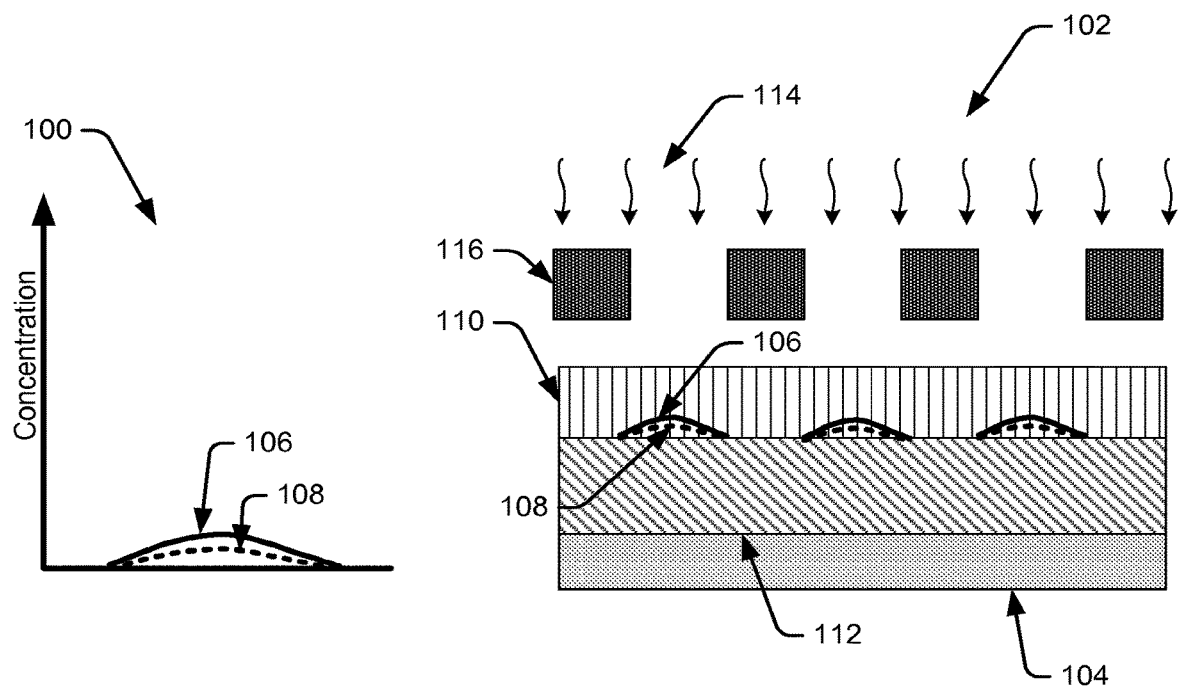
FIG. 1A illustrates a chemical concentration profile for a photoresist layer after being exposed to a first range of light wavelengths and a cross section representation of a film stack on a substrate that is receiving a patterned exposure of the first wavelength of light.
Figure 1B:
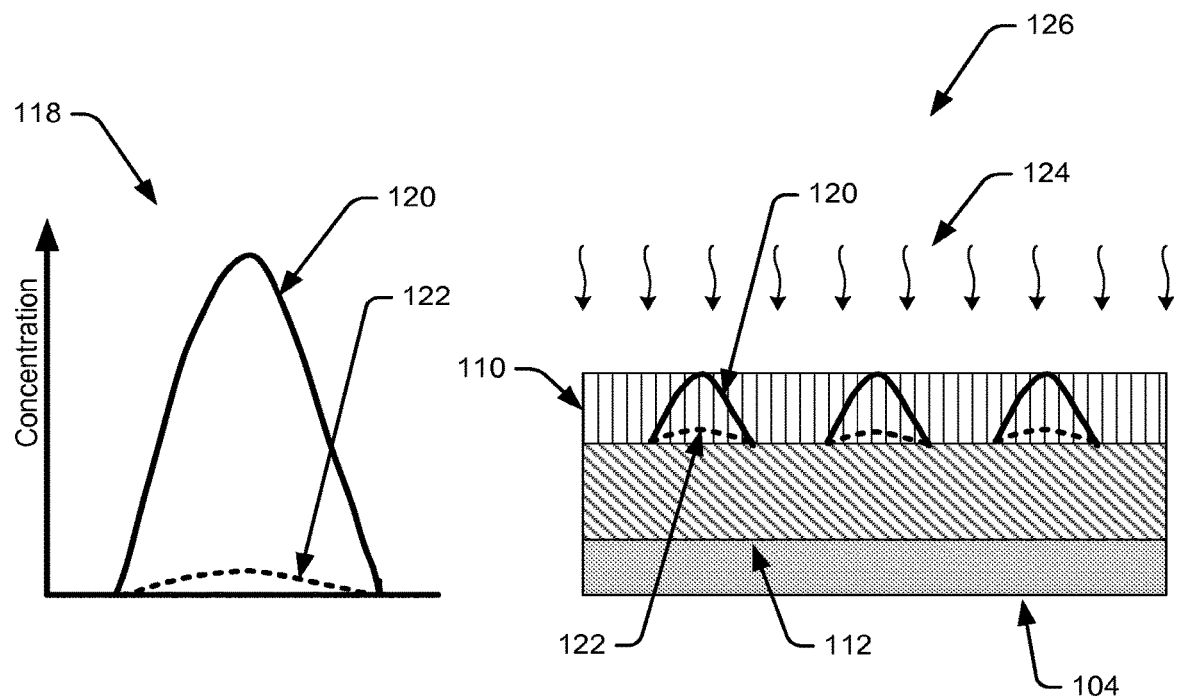
FIG. 1B illustrates a chemical concentration profile for the photoresist layer in FIG. 1A after being exposed to a second range of light wavelengths and a cross section representation of the film stack on that substrate that is receiving a flood exposure to the second range of light wavelengths.

Turning to FIGS. 1A & 1B, FIG. 1A includes a graphic illustration 100 of the concentration of the acid 106 and PS 108 following the first exposure and a cross section diagram 102 of a film stack on a substrate 104. FIG. 1B includes a graphic illustration 118 of the concentration of the acid 120 and PS 122 following the second exposure and a cross section diagram 126 of a film stack on a substrate 104. In one embodiment, the first exposure may have a majority light 114 wavelengths that may be less than 300 nm and a portion of the second exposure may have a majority of light wavelengths that may be greater than 300 nm.

The graphic illustration 100 in FIG. 1A illustrates the results of the first exposure where the PS-CAR may be configured to generate a relatively lower concentration of acid 106 and PS 108 during the first exposure. The first exposure light wavelengths may have a relatively lower energy that generates an initial amount of acid 106 and an initial amount of PS 108. The graphic illustration 100 is used for the purpose of explanation and intended to show the difference in concentrations during the two-step process and is not intended to limit the scale or scope of the concentration during the first or second exposure. The intent is to highlight that the PAG may not be fully decomposed or converted to acid during the first exposure and that the second exposure may increase the acid concentration.

In one embodiment, the film stack may include a photoresist layer 110 deposited on an underlying layer 112 that was formed or deposited on the substrate 104. The photoresist layer 110 may include, but is not limited to the PS-CAR chemistry, and may retain additional elements that may be used to control the reflectivity or absorbance of light. During the first exposure, the initial amount of acid 106 and the initial amount of PS 108 may be generated when the first wavelength of light 114 is exposed through a pattern mask 116. The PS-CAR chemical reaction is initiated when the light 114 interacts with the exposed areas of the photoresist layer 110. The unexposed areas where the light 114 does not interact with the photoresist layer 110, the PS-CAR chemical reaction may not occur or may occur at a minimal or negligible amount compared to the exposed areas. As shown in cross section diagram 102, the concentration of the acid/PS may be higher at the exposed areas of the photoresist layer 110. In this specific embodiment, the acid/PS concentration may be higher at the interface of the photoresist layer 110 and the underlying layer 112. However, the acid/PS concentration may be not required to be higher at the interface of the photoresist layer 110 and the underlying layer 112 in other embodiments. The location of the peak acid/PS concentration may vary depending on the film stack and exposure characteristics.

In FIG. 1B, the second graphic illustration 118 shows a higher level of acid 120 concentration and/or PS concentration 122 following the second exposure of the photoresist layer 110. The second exposure may be a flood or blanket exposure of a second range of light 124 wavelengths. The second exposure may be across the entire photoresist layer 110, such that the PAG may decompose into acid across the photoresist layer 110. However, the PS 122 will increase the acid concentration or decomposition rate of the PAG. The PS 122 may be located in the portions of the photoresist layer 110 that were exposed to the first wavelength 114 during the first exposure. Accordingly, the acid concentration 120 may be higher at those locations relative to the unexposed locations of the first exposure, as shown in the second exposure cross section diagram 126.

The acid concentration 122 and location may be optimized using a variety of characteristics of the photoresist layer 110 and/or underlying layer 112 to control the amount of acid concentration 122 or the location of the acid concentration within the photoresist layer 110 in addition to those techniques described in "Super High Sensitivity Enhancement by Photo-Sensitized Chemically Amplified Resist Process" by Seiichi Tagawa et. al, Journal of Photopolymer Science and Technology, Vol. 26, Number 6 (2013), pgs. 825-830. These techniques may increase the amount of energy that may be transferred to the PAG/PS during the exposure steps to tailor the post-development photoresist 110 profile or geometry.

FIG. 2 includes an illustration of a flow diagram 202 for a method for a two-step exposure process of a film stack (e.g., photoresist layer 110, underlying layer 112) and accompanying cross section representations 200 of one embodiment of the method. The two-step exposure process may be used to enable different responses from elements within the photoresist layer 110. For example, the PS-CAR chemistry may include PAGs that may be used to generate acid that may alter the light sensitivity characteristics of the photoresist layer 110. The method may be performed by one or more process chambers or tools that may deposit, pattern, expose, and/or develop the photoresist layer 110.

At block 204, the substrate 104 may be received by a coating tool that may dispense photoresist onto the surface of the substrate 104. The substrate 104 may include one or more underlying layers 112 that may be patterned using the photoresist layer 110. The thickness and composition of the underlying layer 112 may be optimized to control how light may be reflected from the surface of the substrate 104. In one embodiment, the type of underlying layer 112 may be selected based on the index of refraction and the thickness of the underlying layer 112. These features may be optimized with the characteristics (e.g., index of refraction, thickness, etc.) of the photoresist layer 110 to control how energy may be transferred to the photoresist layer 110 during the two-step exposure process.

At block 206, a photoresist layer 110 may be deposited or dispensed onto the underlying layer 112. The photoresist layer 110 may include two or more light wavelength activation thresholds that may enable a controlled sequence of chemical reactions within the photoresist layer 110 to generate acid at select locations and at different concentrations. The photoresist layer 110 may include a PS-CAR chemistry that may generate different concentrations or amounts of acid depending on the wavelength and/or dose of light 114. For example, when light 114 within a first range of wavelength is exposed to the photoresist layer 110, the PS-CAR chemistry may generate a first amount of acid 106 within the photoresist layer 110. However, the PS-CAR chemistry may be partially decomposed and may still be capable of generating additional acid when the PS-CAR chemistry is exposed to light within a second range of wavelength.

In one embodiment, the first and second ranges of light 114/124 wavelengths may be mutually exclusive and not include any overlap of wavelengths. For example, the first range may be anything less than 200 nm and the second range may be greater than or equal to 200 nm. In other embodiments, the wavelengths may overlap such that the first range may be less than 100 nm and the second range may be anything greater than 5 nm. In one specific embodiment, the first range of light 114 wavelengths may be less than 30 nm (e.g., 13.5 nm) and the second range of light 114 wavelengths may be greater than 200 nm. In another specific embodiment, the first range of light 114 wavelengths may be less than or equal to 193 nm and the second range of light 124 wavelengths may be greater than 200 nm. In another specific embodiment, the first range of wavelengths are less than or equal to 248 nm and the second range of wavelengths are greater than 300 nm. The photoresist layer 110 may be used for dry or immersion lithography processing or KrF laser lithography processing or EUV lithography processing.

In addition to chromophores, the reflectivity may be influenced by the index of refraction and/or thickness of the photoresist layer 110 and/or the underlying layer 112. The index of refraction may be a quantitative representation of how much light 124 will bend or refract when propagating into a medium. The index of refraction may be a ratio between the speed of light in a vacuum and the speed of light within the medium. Altering the direction of the light 124 may enable more energy to be transferred into the photoresist layer 110 and/or the underlying layer 112. For example, the light may be reflected along a longer portion of the film stack or may be reflected back into the photoresist layer 110 from the underlying layer 112 and/or the substrate 104. The incoming light and the reflected light may generate more energy within the film stack due to the interference between the incoming light 124 and the reflected light (not shown). The interference locations may be optimized to occur at desired locations within the film stack by optimizing the index of refraction and/or thickness of the film stack components (e.g., photoresist layer 110, underlying layer 112, and/or substrate 104). Broadly, the index of refraction for the photoresist layer 110 may vary between 0.95 and 1.75 and a thickness may vary between 30 nm to 250 nm. For example, the index of refraction for photoresist layers 110 that target light wavelengths of greater than 300 nm may have an index of refraction between 1.3 to 1.75 and a thickness 80 nm to 250 nm, more particularly between 100 nm to 120 nm. Photoresist layers 110 that target light wavelengths of about 193 nm may range between 1.65 to 1.75 and a thickness 80 nm to 250 nm, more particularly between 100 nm to 120 nm. EUV photoresist layers 110 that target wavelengths of less than 15 nm may have an index of refraction between 0.95 to 1.05 and thickness between 30 nm to 60 nm.

In one embodiment, the film stack properties may be optimized to achieve higher light interference between incident light 124 and reflected light (not shown) at the interface between the photoresist layer 110 and the underlying layer 112. The higher light interference may be tuned to occur within a horizontal plane across the film stack. In one embodiment, the interference plane may be at or proximate to the interface between the photoresist layer 110 and the underlying layer 112. However, the interference plane may not be limited to the interface and may be adjusted using the techniques described in the application or that would be understood by a person of ordinary skill in the art. The higher energy distributed across the interference plane may generate higher concentrations of acid 106 across plane than in other regions of the photoresist layer 110. The higher concentration of acid 106 at the interface may be used to remove or decompose organic substances on the surface of the underlying layer 112 or to tailor the profile angle or geometry of the photoresist layer 110 when it is developed.

In another embodiment, the interference plane may be located at the surface of the photoresist layer 110 that is opposite the interface between the photoresist layer 110 and the underlying layer 112. The higher light interference may generate a higher acid concentration across the photoresist layer 110. The higher acid concentration may alter the profile angle or geometry of the developed photoresist layer 110. For example, the openings in the developed photoresist layer 110 may be wider at the top of the opening than at the interface of the photoresist layer 110 and the underlying layer 112. Controlling the location and concentration of the acid 106 enables the adjustment of the profile angle or geometry of the openings in the photoresist layer 110. These optimized opening geometries may be used to minimize micro-bridging in line/space patterning and/or scumming of contact hole patterning.

At block 208, the two-step process may include exposing a first light 114 wavelength(s) through a pattern mask 116 onto the film stack on the substrate 104. In one embodiment, the photoresist layer 110 may include a PS-CAR chemistry that may generate a low amount of acid 106 when exposed to wavelengths of light that are less than 300 nm. The acid generation may occur proximate to the exposed portions of the photoresist layer 110. The light 114 from the pattern mask 116 may leave unexposed portions of the photoresist layer 110 that may have a lower acid concentration than the exposed portions of the photoresist layer 110.

In other embodiments, the dose and wavelength of the light 124 may be varied to adjust acid concentration amount within the exposed portions of the photoresist layer 110. For example, in a EUV embodiment, the light 114 wavelengths may be less than 15 nm or approximately 13.5 nm. In this instance, the exposure process may limit the light 114 to the EUV spectrum, such that out-of-bound radiation (e.g., UV light, ~>30 nm) may not be exposed to the photoresist layer 110. However, in other embodiments, the light 114 may include a broader range of wavelengths than the EUV embodiment. For example, the light 114 may include wavelengths within the EUV and UV spectrum, but may not include wavelengths from the entire EUV or UV spectrum.

In one specific embodiment, the light 114 may include the EUV spectrum and a portion of the UV spectrum up to 200 nm, but may not include light 114 with a wavelength of greater than 200 nm. For example, the exposure process may include light 114 with wavelengths of no more than 193 nm. However, in another embodiment, the exposure process may include light 114 with wavelengths of not more than 248 nm and may include the 13.5 nm and 193 nm wavelengths.

In another specific embodiment, the light 114 may include the UV spectrum and may exclude the EUV spectrum. Hence, the exposure process may include a 193 nm process or a 248 nm process, but may not include light 114 with a wavelength of less than 30 nm.

The initial amount of acid 106 and PS 108 that may be generated in the exposed regions of the photoresist layer 110 may be increased to a larger amount by exposing the acid 106 and the PS 108 to additional energy (e.g., light 124) to increase the amount of acid and/or diffuse the acid within the photoresist layer 110.

At block 210, the photoresist layer 110 may be exposed to a second range of wavelengths of light 124 that may be different from the wavelength of the first exposure. Additionally, the second exposure may be a blanket exposure or a flood exposure that exposes the entire photoresist layer 110 to the light 124. However, a blanket exposure may not be required and a patterned exposure may be done in the alternative. In one embodiment, the second exposure may include light with wavelengths greater than 300 nm, when the first exposure has wavelengths of less than 300 nm, and more specifically, when the first exposure had wavelengths within the EUV spectrum. In one specific embodiment, the second exposure wavelengths may be about 365 nm when the first exposure had wavelengths less than or equal to about 248 nm, 193 nm, or 13.5 nm. In one specific embodiment, the wavelengths of light 124 may be about 365 nm.

In another embodiment the composition of the underlying layer 112 may be altered to impact reflectivity. For example, the underlying layer 112 may be doped with chromophores (not shown) that may limit reflectivity by absorbing light 124 or selectively absorbing certain light 124 wavelengths and reflecting other light 124 wavelengths. In this way, the chromophores may be selected to absorb certain wavelengths of light to optimize the amount or light wavelengths that may be reflected back into the photoresist layer 110. Typically, chromophores are generally organic compounds that include a carbon element and at least one or more of the following elements: H, O, N, Cl, Br, S, or I. The maximum absorbance wavelength of the chromophore compounds may vary between 250 nm and 400 nm. One or more chromophores may be selected to filter out undesirable light 124 wavelengths that may be reflected by an underlying layer 112 or absorbed by an overlying layer (not shown) of the photoresist layer 110. The chromophore compounds may include, but are not limited to, $CH_3-CH_3$, $CH_4$, $CH_3OH$, or $CH_3-SH$. In addition to the type and concentration, the location of the chromophore within the underlying layer 112 may also impact reflectivity. The reflectivity may be impacted based, at least in part, on where the highest concentration of the chromophore is within the underlying layer 112. The highest concentration may be located at any location within the photoresist layer 110 or the underlying layer 112. Generally, the concentration difference between a high concentration region and a low concentration region may be greater than at least 5% by volume, mass, or moles.

In one embodiment, the chromophore comprises a higher concentration at an interface of the photoresist layer 110 and the underlying layer 112 than the remaining portion of the underlying layer 112 or the photoresist layer 110. In another embodiment, the chromophore comprises a higher concentration proximate to a surface of the photoresist layer 110 that is opposite an interface of photoresist layer 110 and the underlying layer 112. The photoresist layer 110 may have a higher concentration of chromophore than the underlying layer 112. In this instance, the surface or the top portion of the photoresist layer 110 may have the highest chromophore concentration in this film stack embodiment. The light 124 may be reflected or absorbed by the top surface of the photoresist layer 110 which may minimize the amount of energy (e.g., light 124) that may be used to generate acid 106 or PS 108.

At block 212, the photoresist layer 110 may be developed using a chemical treatment to remove portions 214 of the photoresist layer 110 that were made soluble by the two-step exposure process. The photoresist layer 110 may include a positive resist or a negative resist. Exposed portions of the positive resist may become soluble when exposed to light, whereas exposed portions of the negative resist become insoluble. The two-step exposure process may use any type of resist without limitation.

In another embodiment of the two-step process, a bake step may be incorporated either after the first exposure (e.g., EUV) but before the second exposure (e.g., UV flood) or during the second exposure itself. As EUV exposure dose approaches its minimum limits, photon/secondary electron shot statistics problems known as EUV shot noise, may be present. Since the PS 122 is created in close proximity to any converted PAG, the PS 122 will largely replicate the issue. The PS 108 concentration shot noise effect will likely lead to non-optimum line width roughness (LWR), LER, and CER depending on feature without smoothing of PS 108 concentration shot noise effects prior to or in-situ to UV flood excitation, the PS 108 concentration shot noise. This issue may be overcome by the incorporation of a bake step prior to or during the UV flood step to induce PS 108 diffusion, on the order sub 10 nm, to smooth out the PS 108 concentration shot noise and lead to better LWR, LER, and CER depending on feature type. Ideally, the activation energy for PS 108 diffusion could be designed such that it is much lower than the acid diffusion and amplification activation energies, so that a pre-flood or in-situ flood bake could effectively only lead to PS 108 diffusion. If this is not the case, then some level of flood bake and traditional post exposure bake (after PS 122 has converted additional PAGs to acids) co-optimization may be needed.

In one embodiment, the bake step may include heating the substrate, following the first exposure, to between 30° C. to 60° C. for no more than 120 seconds. Alternatively, the heating could also be done between 30° C. to 90° C. for no more than 120 seconds. In certain instances, a bake step may be done after the second exposure to improve LWR. The second heating process may be between 80° C. to 130° C. for no more than 120 seconds.

Other embodiments of the two-step process may include additional techniques to vary how light 124 may be reflected within the film stack. This may include adding an overlying layer to the film stack shown in FIG. 2.

FIGS. 3A-3B include an illustration of a flow diagram 300 of a method for a two-step exposure process of a film stack and accompanying cross section representations 302 of one embodiment of the method. In addition to varying the photoresist layer 110 and the underlying layer 112, the reflectivity and absorption of light in the film stack may also be varied by adding and/or removing components of the film stack. The amount of light 114 and/or the location of the interference plane may be optimized to impact the amount of acid 106 or PS 108 that is generated during the first exposure or the amount of acid 120 or PS 122 during the second exposure. The film stack composition may be modified prior to and/or after the first exposure.

At block 304, the substrate is received comprising an underlying layer 112 and a photoresist layer 110 on the underlying layer 112. The photoresist layer 100 may include two or more light wavelength activation thresholds that may enable a controlled sequence of chemical reactions within the photoresist layer 110 to generate acid at select locations and at different concentrations. The photoresist layer 110 may include a PS-CAR chemistry that may generate different concentrations or amounts of acid depending on the wavelength and/or dose of light 114. For example, when light 114 within a first range of wavelength is exposed to the photoresist layer 110, the PS-CAR chemistry may generate a first amount of acid 106 within the photoresist layer 110. However, the PS-CAR chemistry may be partially decomposed and may still be capable of generating additional acid when the PS-CAR chemistry is exposed to light within a second range of wavelength. The photoresist layer 110 and the underlying layer 112 may also be configured using the techniques or methods to optimize reflectivity or absorbance as described in the description of FIG. 2. The reflectivity and absorbance characteristics of the film stack may be optimized by adding or removing additional layers prior to and/or after the exposure. For example, a top coat deposited on the photoresist layer 110 may be used to filter out-of-band wavelengths or undesirable wavelengths.

At block 306, a first top coat layer 314 may be deposited on the photoresist layer 110 to control the type of wavelength and/or energy exposed to the photoresist layer 100. The deposition may be accomplished by spraying or dispensing a solution or droplets onto the surface of the photoresist layer 110. The first top coat layer 314 may be used to reflect or absorb certain light 114 wavelengths to control the acid 106 and PS 108 concentration during the first exposure. The wavelength restriction may apply to portions along the EUV and UV spectrum to prevent or combine overlap of the spectrums or to limit the exposure within portions of each spectrum. For example, the first top coat layer 314 may be used to filter any wavelength greater than 30 nm during the first exposure. However, in other embodiments, one or more ranges of light 114 wavelengths may be filtered or reflected away from the photoresist layer 110.

At block 308, a first range of light 114 wavelengths may be exposed to the photoresist layer 110 and the top coat layer 314 through a patterned mask 116. As described in the descriptions of FIGS. 1A-1B and 2, the exposed areas may have a higher concentration acid 106 and PS 108 than the unexposed areas. However, portions of the light 114 wavelengths may have been reflected or absorbed by the first top coat layer 314 prior to reaching the photoresist layer 110. Nissan Chemical Industries of Tokyo, Japan manufactures a EUV top coat chemical (e.g., Out of Band Protection Layer (OBPL) series) that may be used to apply the top coat layer 314 to the photoresist layer 110. The EUV top coat may have a high absorption of non-EUV spectrum (e.g., DUV spectrum) wavelengths and a high transmittance for the EUV spectrum (e.g., 13.5 nm). The first top coat layer 314 may also prevent outgassing or mixing with the photoresist layer 110.

The two-step exposure process may need a different light 124 wavelength to generate a second chemical reaction within the photoresist layer 110. However, the presence of the first top coat layer may reflect or absorb non-EUV wavelengths.

At block 310, the substrate 104 may be processed to remove the first top coat layer 314 and to expose the photoresist layer 110. A person of ordinary skill in the art may use a wet or dry chemical technique to remove the first top coat layer 314, such as a chemical bath treatment or a plasma treatment. The removal process may be designed to limit acid generation within the photoresist layer 110 prior to the second exposure. For example, the plasma treatment may be designed to minimize or not generate energy that may decompose the PAGs or excite the PS 108.

At block 312, the substrate 104 may be exposed to a second range of light 126 wavelengths that may decompose the PAG and/or excite the PS 122 to decompose the PAG to generate a higher concentration of acid 120 within the photoresist layer 110. The second exposure may be a blanket exposure that distributes light 124 across the entire photoresist layer 104. As a result of the blanket exposure, the portions of the photoresist layer 110 that include the PS 122 will have a higher acid 120 generation rate or concentration than the portions of the photoresist layer 110 that do not include the PS 122 or, at least, a lower concentration of the PS 122.

In other embodiments, the second exposure may be a patterned exposure that may use a mask to generate exposed and unexposed areas in the photoresist layer 110. The mask may or may not be the same mask 116 that was used during the first exposure. In this way, the photoresist layer 110 may include three or more different regions that have varying amounts of acid. Hence, the developed photoresist layer 110 may have openings with at least two different profile angles or geometries.

In another embodiment, a second top coat layer (not shown) is deposited on to the photoresist following the removal of the first top coat layer, wherein the second top coat layer prevents light with a wavelength of less than 300 nm from reaching the photoresist.

It should be understood that the foregoing description is only illustrative of the invention. Various alternatives and modifications can be devised by those skilled in the art without departing from the invention. Accordingly, the present invention is intended to embrace all such alternatives, modifications and variances that fall within the scope of the appended claims.

What is claimed is:

1. A method for photolithography on a substrate, comprising:
   receiving the substrate comprising an underlying layer on the substrate, the underlying layer comprising an underlying layer index of refraction and an underlying layer thickness; and
   depositing a photoresist layer on the underlying layer, the photoresist layer comprising:
      a first light wavelength activation threshold that controls a generation of acid to a first acid concentration in the photoresist layer;
      a second light wavelength activation threshold that increases the first acid concentration to a second acid concentration, the second light wavelength activation threshold being different from the first light wavelength activation threshold;
      a photoresist index of refraction;
      a photoresist thickness; and
      an interference plane located at an interface of the underlying layer and the photoresist layer, or at a surface of the photoresist layer opposite the interface of the photoresist layer and the underlying layer, or at an intermediate location in-between the interface and the surface of the photoresist layer opposite the interface of the photoresist layer and the underlying layer;
   exposing a first wavelength of light through a patterned mask onto the substrate; and
   exposing a second wavelength of light to the substrate, the second wavelength of light comprising a wavelength that is different from the first wavelength of light,
   wherein a relatively higher light intensity interference occurs at the interference plane than at any other planar location in the photoresist layer due to reflection off of the underlaying layer only during exposure with one of the first wavelength of light and the second wavelength of light, the method further comprising:
   depositing a EUV top coat layer on the photoresist layer before exposing the first wavelength of light;
   removing the EUV top coat layer before exposing the second wavelength of light; and
   developing the photoresist layer after exposing the second wavelength of light,
   wherein the EUV top coat layer is transparent to the EUV spectrum and exposing the first wavelength of light includes exposing the first wavelength of light onto the EUV top coat layer and the photoresist layer, the first wavelength of light comprising a wavelength in the EUV spectrum, and
   wherein the second exposure is a blanket exposure of the substrate.

2. The method of claim 1, wherein the photoresist index of refraction comprises a value between 0.9 and 1.7.

3. The method of claim 1, wherein the photoresist thickness comprises a value between 30 nm and 60 nm.

4. The method of claim 1, wherein the first wavelength of light comprises a magnitude of less than 30 nm and the second wavelength of light comprises a magnitude of greater than or equal to 30 nm.

5. The method of claim 1, further comprising:
   heating the substrate, following the exposure of the first wavelength of light, to between 30° C. to 90° C. for no more than 120 seconds.

6. The method of claim 5, further comprising:
   heating the substrate, following the exposure of the second wavelength of light, to between 80° C. to 130° C. for no more than 120 seconds.

7. The method of claim 1, wherein the EUV top coat layer is configured to:
   reduce outgassing from the photoresist layer during the exposure of the first wavelength of light,
   reduce a generation of inadvertent acid photolysis from out-of-band radiation from the exposure of the first wavelength of light, and
   allow the first wavelength of light to pass through to the photoresist layer.

8. The method of claim 1, wherein the EUV top coat layer comprises a refractive index between 0.9 and 1.1.

9. The method of claim 1, wherein the location of the interference plane is adjusted by adjusting one or more of the index of refraction of the photoresist, the thickness of the photoresist, or the thickness of the underlying layer.

10. The method of claim 1, wherein exposing the first wavelength of light generates an exposed portion of the photoresist layer and an unexposed portion of the photoresist layer, and wherein exposing the second wavelength of light includes exposing the exposed portion and the unexposed portion to the second wavelength of light.

11. The method of claim 10, wherein after exposing the first wavelength of light and the second wavelength of light, the method further comprises:
   developing the photoresist layer.

12. The method of claim 1, wherein the first wavelength of light is at or above the first light wavelength activation threshold and lower than the second light wavelength activation threshold, and the second wavelength of light is at or above the second light wavelength activation threshold.

13. A method for photolithography on a substrate, comprising:
   receiving the substrate comprising an underlying layer on the substrate, the underlying layer comprising an underlying layer index of refraction and an underlying layer thickness; and
   depositing a photoresist layer on the underlying layer, the photoresist layer comprising:
      a first light wavelength activation range that controls a generation of acid to a first acid concentration in the photoresist layer;
      a second light wavelength activation range that increases the first acid concentration to a second acid concentration, the second light wavelength activation range being different from the first light wavelength activation range;

a photoresist index of refraction;

a photoresist thickness; and an interference plane located at an interface of the underlying layer and the photoresist layer, or at a surface of the photoresist layer opposite the interface of the photoresist layer and the underlying layer, or at an intermediate location in-between the interface and the surface of the photoresist layer opposite the interface of the photoresist layer and the underlying layer;

exposing a first wavelength of light through a patterned mask onto the substrate, the first wavelength of light being within the first light wavelength activation range; and exposing a second wavelength of light to the substrate, the second wavelength of light being within the second light wavelength activation range, wherein a relatively higher light intensity interference occurs at the interference plane than at any other planar location in the photoresist layer due to reflection off of the underlaying layer only during exposure with one of the first wavelength of light and the second wavelength of light, the method further comprising:

depositing a EUV top coat layer on the photoresist layer before exposing the first wavelength of light;

removing the EUV top coat layer before exposing the second wavelength of light; and developing the photoresist layer after exposing the second wavelength of light, wherein the EUV top coat layer is transparent to the EUV spectrum and exposing the first wavelength of light includes exposing the first wavelength of light onto the EUV top coat layer and the photoresist layer, the first wavelength of light comprising a wavelength in the EUV spectrum, and wherein the second exposure is a blanket exposure of the substrate.

14. The method of claim 13, wherein the photoresist index of refraction comprises a value between 0.9 and 1.7.

15. The method of claim 13, wherein the photoresist thickness comprises a value between 30 nm and 60 nm.

16. The method of claim 13, wherein the first wavelength of light comprises a magnitude of less than 30 nm and the second wavelength of light comprises a magnitude of greater than or equal to 30 nm.

17. The method of claim 13, further comprising:

heating the substrate, following the exposure of the first wavelength of light, to between 30° C. to 90° C. for no more than 120 seconds.

18. The method of claim 17, further comprising:

heating the substrate, following the exposure of the second wavelength of light, to between 80° C. to 130° C. for no more than 120 seconds.

19. The method of claim 13, wherein the EUV top coat layer is configured to:

reduce outgassing from the photoresist layer during the exposure of the first wavelength of light, reduce a generation of inadvertent acid photolysis from out-of-band radiation from the exposure of the first wavelength of light, and allow the first wavelength of light to pass through to the photoresist layer.

20. The method of claim 13, wherein the EUV top coat layer comprises a refractive index between 0.9 and 1.1.

21. The method of claim 13, wherein exposing the first wavelength of light generates an exposed portion of the photoresist layer and an unexposed portion of the photoresist layer, and wherein exposing the second wavelength of light includes exposing the exposed portion and the unexposed portion to the second wavelength of light.

22. The method of claim 21, wherein after exposing the first wavelength of light and the second wavelength of light, the method further comprises:

developing the photoresist layer.

* * * * *

UNITED STATES PATENT AND TRADEMARK OFFICE
CERTIFICATE OF CORRECTION

PATENT NO.        : 10,534,266 B2
APPLICATION NO.   : 15/445738
DATED             : January 14, 2020
INVENTOR(S)       : Michael A. Carcasi et al.

Page 1 of 1

It is certified that error appears in the above-identified patent and that said Letters Patent is hereby corrected as shown below:

In the Specification

Column 8, Lines 16-17, change "lengths of light to optimize the amount or light wavelengths that may be reflected" to --lengths of light to optimize the amount of light wavelengths that may be reflected--.

In the Claims

Column 11, Line 56, Claim 1, change "the underlaying layer only during" to --the underlying layer only during--.

Column 13, Line 22, Claim 13, change "the underlaying layer only during" to --the underlying layer only during--.

Signed and Sealed this
Thirty-first Day of March, 2020

Andrei Iancu
*Director of the United States Patent and Trademark Office*